(12) United States Patent
Solic

(10) Patent No.: US 7,015,728 B1
(45) Date of Patent: Mar. 21, 2006

(54) HIGH VOLTAGE FLOATING CURRENT SENSE AMPLIFIER

(75) Inventor: Eric M. Solic, Durham, NC (US)

(73) Assignee: Intersil Americas Inc., Milpitas, CA (US)

( * ) Notice: Subject to any disclaimer, the term of this patent is extended or adjusted under 35 U.S.C. 154(b) by 42 days.

(21) Appl. No.: 10/886,368

(22) Filed: Jul. 7, 2004

Related U.S. Application Data

(60) Provisional application No. 60/548,602, filed on Feb. 27, 2004.

(51) Int. Cl.
G01R 19/00 (2006.01)
G11C 7/00 (2006.01)
H03F 3/45 (2006.01)

(52) U.S. Cl. .......................... 327/51; 327/54; 320/149
(58) Field of Classification Search ................ 320/149; 327/51, 52, 53, 54, 56, 65, 77
See application file for complete search history.

(56) References Cited

U.S. PATENT DOCUMENTS

| | | | |
|---|---|---|---|
| 3,944,904 A | 3/1976 | Hase | |
| 3,997,888 A | 12/1976 | Kremer | |
| 4,037,972 A | 7/1977 | Pross | |
| 4,137,493 A * | 1/1979 | Smith | 320/148 |
| 4,227,141 A | 10/1980 | Cross | |
| 4,661,766 A | 4/1987 | Hoffman et al. | |
| 5,497,125 A | 3/1996 | Royds | |
| 5,498,984 A * | 3/1996 | Schaffer | 327/51 |
| 6,054,861 A * | 4/2000 | Takahashi | 324/428 |
| 6,157,170 A | 12/2000 | Noda et al. | |
| 6,184,660 B1 | 2/2001 | Hatular | |
| 6,335,611 B1 | 1/2002 | Sasaki | |
| 6,621,259 B1 * | 9/2003 | Jones et al. | 324/123 C |
| 6,703,893 B1 | 3/2004 | Isham | |
| 6,791,314 B1 * | 9/2004 | Bortolussi | 324/126 |
| 2002/0005738 A1 * | 1/2002 | Inn | 327/51 |

OTHER PUBLICATIONS

Burr-Brown Corporation, Wideband Switched-Input Operational Amplifier, Mar. 1998, pp. 1-15, Tucson, AZ, SBOS012.
Tom Anderson, SWOP AMPS Simplify RF Signal Processing, Burr-Brown Corporation, Jan. 1994, 2 pages, Tucson, AZ, SBOA041.
Unitrode Products from Texas Instruments, Switch-Mode Lithium-Ion Battery Charge Controller, Feb. 1997, pp. 1-14, UCC3956.

* cited by examiner

*Primary Examiner*—Kenneth B. Wells
*Assistant Examiner*—Khareem E. Almo
(74) *Attorney, Agent, or Firm*—Gary R. Stanford

(57) ABSTRACT

A high voltage floating current sense amplifier circuit, including first and second resistive devices and a floating amplifier circuit, that senses current through a current sense device coupled between an output node and a battery node each referenced to a common node. The battery node couples to a positive terminal of a removable battery. The floating amplifier circuit drives a proportional current through the first resistor in order to maintain voltage across the first resistive device at approximately the same voltage as that across the current sense device. The second resistive device has a first end coupled to the common node and a second end coupled to receive the proportional current for developing a sense voltage indicative of current through the current sense device.

12 Claims, 4 Drawing Sheets

HIGH VOLTAGE FLOATING CURRENT SENSE AMPLIFIER

CROSS-REFERENCE TO RELATED APPLICATIONS

This application claims the benefit of U.S. Provisional Application Ser. No. 60/548,602, filed on Feb. 27, 2004, which is herein incorporated by reference for all intents and purposes.

This application is related to the following co-pending U.S. patent application, which has a common assignee and at least one common inventor, and which is herein incorporated by reference in its entirety for all intents and purposes:

| SERIAL NUMBER | TITLE |
| --- | --- |
| TBD (INSL. 0099; PROVISIONAL SN: 60/548,396) | RAIL-RAIL CURRENT SENSE AMPLIFIER |

BACKGROUND OF THE INVENTION

1. Field of the Invention

The present invention relates to current sense devices, and more particularly to a high voltage floating current sense amplifier.

2. Description of the Related Art

Portable devices, including laptop computers and the like, include a rechargeable battery that provides power to the device when AC power is not available. The battery is typically removable, and is either not connected or is connected and receiving charge current from battery charging circuitry when AC power is available. The charging circuitry includes a current sense circuit which monitors charge current so that the battery charging process may be controlled. The current sense circuit usually includes a current sense device, such as a small-valued current sense resistor or the like, which is coupled in the charge path of the battery and a current sense amplifier coupled to sense voltage across the current sense device, which voltage is proportional to the charge current.

In conventional designs, the current sense device is located at the positive terminal of the battery and the sense amplifier includes power rails with a voltage level that is typically significantly smaller than the voltage of the battery. The current sense circuit, therefore, performs two functions, including level shifting to within the voltage range of the sense amplifier, and gain to amplify the sense voltage by a suitable amount. The gain function places the voltage range within appropriate voltage ranges for a variety of conditions, including low battery voltage and high charge current, and high battery voltage and low (e.g., trickle) charge current.

It is readily apparent that the relatively small voltage signal across the current sense device is attenuated by a relatively large factor down to an even smaller voltage level. Such attenuation was otherwise necessary to attenuate the higher battery voltage levels to the lower voltage levels suitable for the sense amplifier. The sense amplifier required a relatively high gain, such as on the order of about 100 or so, in order to place the output sense voltage in a suitable voltage range for monitoring circuitry. In this configuration, the inherent voltage offsets of the sense amplifier became a proportionately larger factor in the measurement range resulting in relatively inaccurate charge current measurement. It is desired to avoid significant attenuation of the measurement signal while also enabling the use of lower voltage measurement devices.

SUMMARY OF THE INVENTION

A high voltage floating current sense amplifier circuit according to an embodiment of the present invention includes first and second resistive devices and a floating amplifier circuit. The high voltage floating current sense amplifier circuit is operative to sense current through a current sense device coupled between an output node and a battery node each referenced to a common node, where the battery node couples to a positive terminal of a removable battery. The first resistive device has a first end coupled to the output node. The floating amplifier circuit is coupled to a second end of the first resistive device and to the battery node, and is operative to drive a proportional current through the first resistor in order to maintain voltage at the second end of the first resistive device at approximately the same voltage as the battery node. The second resistive device has a first end coupled to the common node and a second end coupled to receive the proportional current for developing a sense voltage indicative of current through the current sense device.

In one embodiment, the floating amplifier circuit includes a P-channel device and a floating differential amplifier. The P-channel device has a source coupled to the second end of the first resistive device and a drain coupled to the second end of the second resistive device. The floating differential amplifier has a power input and a non-inverting input coupled to the battery node, and has an inverting input and an output coupled to the source and to the gate, respectively, of the P-channel device. In a more specific embodiment, the floating differential amplifier includes low voltage devices implemented on N diffusion areas within a P-type substrate in which the N diffusion areas are biased relative to the output node. Also, the floating differential amplifier may include at least one bias node, each coupled to a high voltage current source that enables each bias node to float with the battery node.

A power circuit implemented according to an embodiment of the present invention includes a switching regulator, a current sense device, a floating high voltage current sense amplifier circuit, and a first resistive device. The switching regulator provides power current to an output node having up to a maximum voltage level relative to a common node having a reference voltage level. The current sense device has a first end coupled to the output node and a second end coupled to a battery node. The battery node couples to a positive terminal of a removable battery that couples between the battery and common nodes. The floating high voltage current sense amplifier circuit develops a sense current that is proportional to current through the current sense device for voltages of the output node. The first resistive device has a first end coupled to the common node and a second end coupled to the floating high voltage current sense amplifier circuit to receive the sense current and to develop a current sense output voltage.

The floating high voltage current sense amplifier circuit may include a second resistive device, a P-channel device and a floating differential amplifier. The second resistive device has a first end coupled to the output node. The P-channel device has a source coupled to a second end of the second resistive device and a drain coupled to the second end of the first resistive device. The floating differential amplifier has an output coupled to a gate of the P-channel device, an inverting input coupled to the source of the P-channel device, and a power input and a non-inverting input coupled to the battery node.

A method of sensing current through a current sense device for higher voltages up to a maximum voltage level, in which the current sense device is coupled between an output node and a battery node that couples to the high side of a removable battery, includes coupling a first end of a first resistive device to the output node, providing a floating differential amplifier that floats with the battery node, driving a P-channel device coupled to a second end of the first resistive device with the floating amplifier to maintain voltage across the first resistive device substantially equal to voltage across the current sense device to develop a proportional current through the first resistive device, and applying the proportional current to a second resistive device to develop a current sense output voltage.

The method may include coupling a power input and a non-inverting input of the floating differential amplifier to the battery node. The method may include implementing the floating differential amplifier with low voltage devices formed on N diffusion areas within a P-type substrate and biasing the N-diffusion areas relative to the output node. The method may include providing the floating differential amplifier with one or more bias nodes and coupling each bias node to a current source implemented with high a voltage device that enables each bias node to float with the battery node.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
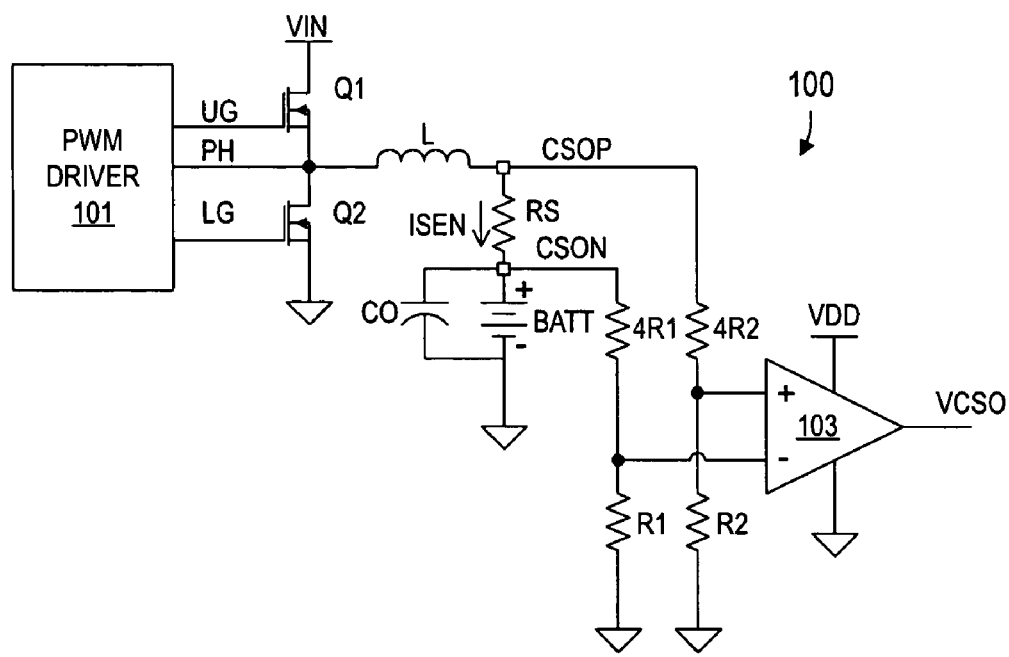
FIG. 1 is a simplified schematic diagram of a exemplary battery charge system employing a conventional type charge current measuring circuit.

FIG. 1 is a simplified schematic diagram of a conventional battery charge system 100. A pulse-width modulation (PWM) driver circuit 101 generates upper gate (UG) and lower gate (LG) switching signals to drive the gates of a pair of switching devices Q1 and Q2 as known to those skilled in the art. The switching devices Q1 and Q2 are shown as metal-oxide semiconductor, field-effect transistor (MOSFET) type devices, although other types of switching devices and FETs are contemplated. As shown, the drain of Q1 is coupled to an input voltage VIN and the source of Q1 is coupled to an intermediate phase node PH. The PH node is fed back to the PWM driver circuit 101 and is coupled to one end of an output inductor L and to the drain of Q2. The source of Q2 is coupled to the lower terminal of the power supply, which is a common node or ground (GND) having a reference voltage level (e.g., 0V). The other end of inductor L develops a current sense output positive (CSOP) node, which is coupled to one end of a sense resistor RS. Each node develops a signal with the same name and the node is also referred to by its signal name unless otherwise specified. The other end of resistor RS is a current sense output negative (CSON) node, which is coupled to the positive terminal of a removable battery BATT and to one end of an output capacitor C0. The negative terminal of the battery BATT (when connected) and the other end of the capacitor C0 are coupled to ground.

A sense amplifier 103 is provided to sense the voltage across the resistor RS, where the sensed voltage is indicative of the current through the resistor RS shown as a current ISEN. The current ISEN through the resistor RS is the charging current applied through the battery BATT when connected. A first resistor 4R1 is coupled between CSON and the inverting (−) input of the amplifier 103 and a second resistor 4R2 is coupled between CSOP and the non-inverting (+) input of the amplifier 103. A third resistor R1 is coupled between the inverting input of the amplifier 103 and ground and a fourth resistor R2 is coupled between the non-inverting input of the amplifier 103 and ground. The resistors 4R1 and 4R2 each have approximately four times the resistance value of the resistors R1 and R2, respectively. The amplifier 103 receives power via a voltage rails VDD and ground and generates a current sense output voltage VCSO at its output. VDD is a typical logic circuit voltage level, such as 5 volts (V) or the like.

In operation, the PWM driver 101 toggles on and off the switches Q1 and Q2 to deliver charge current to the battery BATT via the inductor L. The particular configuration shown is in the form of a buck converter, although other types of converters or regulators are contemplated. The ISEN current charges the battery BATT, and typically ranges between a relatively low value, such as 0.15 Amperes (A) and a relatively large value, such as 4A. The sense resistor RS is a relatively small-valued resistor such as, e.g., 20 milliohms (mΩ), to prevent significant power consumption, voltage drop and/or heat generation. Alternative resistance values and/or current sensing devices are contemplated. Even at the higher level of charge current of 4A, the voltage drop across the sense resistor RS between CSOP and CSON is approximately 80 millivolts (mV). Yet the voltage of CSON may be relatively high, such as 14V or the like when the battery BATT is connected. The voltage-divider resistor pairs 4R1/R1 and 4R2/R2 divide the voltages of CSON and CSOP, respectively, by a factor of five and the amplifier 103 typically amplifies the voltage differential by a gain factor of about 100. Thus, the voltages applied to the inputs of the sense amplifier 103 are in the range of 0–4V (e.g., 2.8V and 2.81V), the voltage differential is in the 16 mV range, and the VCSO voltage ranges between approximately 0–2V.

It is readily apparent that the relatively small voltage signal between CSOP and CSON, or about 100 mV is attenuated by a relatively large factor (e.g., 5) down to an even smaller voltage level of 20 mV or so at the higher current levels. Such attenuation was otherwise necessary to attenuate the higher battery voltage levels to the lower voltage levels suitable for the amplifier 103. The amplifier 103 requires a relatively high gain, such as on the order of about 100 or so, in order to place the output sense voltage VCSO in a suitable voltage range for monitoring circuitry. In this configuration, the inherent voltage offsets of the amplifier 103 become a proportionately larger factor in the measurement range resulting in relatively inaccurate charge current measurement. It is desired to avoid significant attenuation of the measurement signal while also enabling the use of lower voltage measurement devices.

Figure 2:
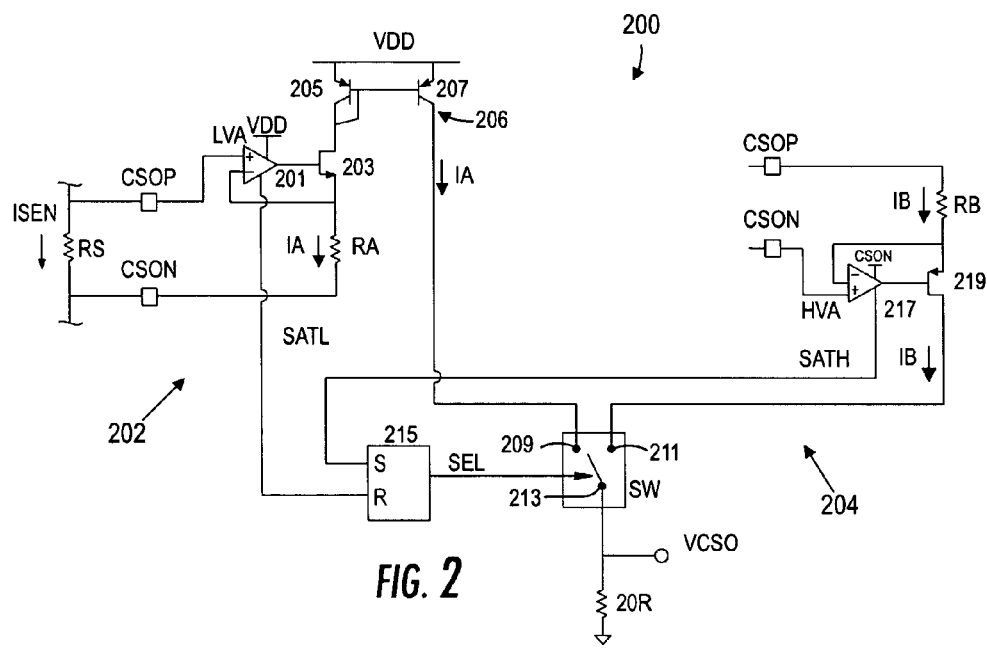
FIG. 2 is a simplified schematic diagram of a rail to rail current sense amplifier employing a high voltage floating current sense amplifier implemented according to an exemplary embodiment of the present invention.

FIG. 2 is a simplified schematic diagram of a rail to rail (or rail—rail) current sense amplifier 200 employing a high voltage floating current sense amplifier 217 implemented according to an exemplary embodiment of the present invention. The current sense amplifier 200 is coupled to the CSOP and CSON nodes across the resistor RS and replaces the amplifier 103 and the resistors 4R1/R1 and 4R2/R2 of the battery charge system 100. The voltage at CSON is the voltage of the battery BATT when connected. The current sense amplifier 200 includes a low voltage portion 202 and a high voltage portion 204. For the low voltage portion 202, the CSOP node is coupled to the non-inverting (+) input of a low voltage amplifier (LVA) 201, which has its inverting (−) input coupled to one end of a resistor RA and to the source of an N-channel FET 203. The CSON node is coupled to the other end of the resistor RA. The drain of the FET 203 is coupled to the collector and base of a PNP bipolar junction transistor (BJT) 205 and to the base of another PNP bipolar junction transistor 207. The bipolar transistors described herein are typically BJTs, although other types of transistors are contemplated. The emitters of the transistors 205, 207 are coupled to VDD, and the transistors 205 and 207 collectively form a current mirror 206. The collector of the transistor 207 is coupled to one switched terminal 209 of a single pole, double-throw (SPST) switch SW, having a center or common pole 213 developing the current sense output voltage VCSO. The center pole 213 of the switch SW is also coupled to one end of a resistor 20R, which has its other end coupled to ground.

The switch SW has a control input receiving a select signal SEL for selectively coupling the center pole 213 to either one of the terminals 209 or 211. The SEL signal is driven by the output of a set-reset (SR) latch 215, as further described below. When SEL is set high, the terminal 209 is selected to select the low voltage portion 202 and when reset low, the terminal 211 is selected to select the high voltage portion 204. Alternative switching devices are contemplated, such as logic devices such as multiplexers (MUXs) or the like. The switch SW is shown to clearly illustrate the switching function between the low and high voltage portions 202 and 204. It is noted that the LVA 201 receives the VDD source voltage, which is typically a lower voltage such as 5V or the like. Thus, the LVA 201 is only operable up to lower voltage levels, such as up to an upper threshold voltage of approximately 3V. The particular threshold voltage is arbitrary and may vary depending upon specific implementations and/or configurations. When the voltage of CSON rises above the upper threshold voltage (e.g., above 3V), the LVA 201 reaches saturation and asserts a saturation signal SATL, which is provided to the reset (R) input of the SR latch 215. Assertion of the reset input clears the SR latch 215 pulling the SEL signal low, which switches the switch SW to terminal 211 to select the high voltage portion 204.

The CSOP signal is also coupled to one end of a resistor RB, having its other end coupled to the inverting (−) input of the floating high voltage amplifier (HVA) 217 and to the source of a P-channel FET 219. The CSON signal is coupled to the non-inverting (+) input of the HVA 217, which has its output coupled to the gate of the FET 219. The drain of the FET 219 is coupled to the terminal 211 of the switch SW. The HVA 217 receives source voltage from the CSON signal and thus operates as a floating voltage amplifier as further described below. The HVA 217 operates up to the upper rail of the battery voltage, such as up to 20V or the like, and down to a lower threshold voltage, such as approximately 2V. The particular threshold voltage is arbitrary and may vary depending upon specific implementations and/or configurations. When the inputs of the HVA 217 drop below the common mode input range of the HVA 217 (e.g., below 2V), it saturates and asserts a saturation signal SATH, which is provided to the set (S) input of the SR latch 215.

In operation of the low voltage portion 202, the LVA 201 senses the voltage of CSOP and drives the FET 203 to maintain the voltage at the source of the FET 203 to the same voltage level as CSOP. In this manner, since the other end of the resistor RA is coupled to CSON, the LVA 201 drives the FET 203 as a current device to maintain the voltage drop across the resistor RA to be the same as the voltage across the resistor RS between CSOP and CSON. This causes a current IA to flow through resistor RA, in which this same current is pulled from the collector of the transistor 205. The IA current may be, but is not necessarily, the same as the ISEN current depending upon the relative resistance values of RS and RA. In one embodiment, the resistance of RA is significantly greater than that of RS so that IA is significantly less than ISEN. The transistors 205 and 207 are coupled in a current mirror configuration to form the current mirror 206, so that the same (or proportional) current IA is provided from the collector of transistor 207 to the terminal 209 of the switch SW and through the resistor 20R when the terminal 209 is selected by the SEL signal. The resistor 20R has a resistance value that is approximately 20 times that of RA (e.g., the resistance of RA=R), so that the voltage of VCSO, relative to ground, is approximately twenty times that of the voltage across RA to achieve a gain factor of twenty. Since the voltage across RA is driven to be the same as the voltage across RS, the voltage of VCSO is twenty times the voltage across RS between CSOP and CSON. Furthermore, the VCSO voltage is level shifted from the battery voltage (CSON) to ground.

In operation of the high voltage portion 204, the HVA 217 senses the voltage of CSON and drives the FET 219 to maintain the voltage at the source of the FET 219 to the same voltage level as CSON. In this manner, the voltage drop across the resistor RB is the same as the voltage across the resistor RS between CSOP and CSON. This causes a current IB to flow through resistor RB from CSOP, in which this same current is provided to the terminal 211 of the switch SW. The IB current may be, but is not necessarily, the same as the ISEN current depending upon the relative resistance values of RS and RB. In one embodiment, the resistance of RB is significantly greater than that of RS so that IB is significantly less than ISEN. The resistor 20R has a resistance value that is approximately 20 times that of RB (e.g., RA=RB=R), so that the voltage of VCSO, relative to ground, is approximately twenty times that of the voltage across RB to achieve a gain factor of twenty when the terminal 211 is selected by the switch SW. Since the voltage across RB is driven to be the same as the voltage across RS, the voltage of VCSO is twenty times the voltage across RS between CSOP and CSON. Furthermore, the voltage of VCSO is level shifted from CSON to ground.

It is appreciated that the sense voltage across RS is not attenuated for purposes of current sense measurement as was done in prior designs such as illustrated by the battery charge system 100. Instead, the voltage across RS is sensed, level-shifted and amplified by the low voltage portion 202 employing the LVA 201 down to ground and up to the higher voltage threshold (e.g., 3V) and by the high voltage portion 204 employing the HVA 217 down to the lower voltage threshold (e.g., 2V) and up to the upper voltage level of the battery BATT. In this manner, the current sense amplifier 200 operates rail to rail and provides accurate sensing and amplifying of the battery charge current.

Figure 3:
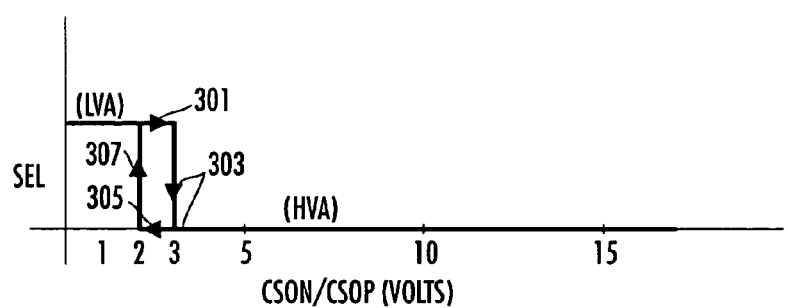
FIG. 3 is a graph diagram plotting the battery voltage (CSON/CSOP) relative to the SEL signal of FIG. 2.

FIG. 3 is a graph diagram plotting the approximate voltage of CSON/CSOP relative to the SEL signal. When CSON/CSOP is below 2V, the SATH signal is asserted high and the SATL signal is asserted low, so that the SEL signal is asserted high by the SR latch 215. When the SEL signal is high, the switch SW selects the low voltage portion 202 via the terminal 209. When the CSON/CSOP voltage is low and then rises above the lower threshold voltage (2V) but is still below the upper threshold voltage (3V) as shown at 301, the SATH signal is negated low. Since the SR latch 215 is not reset, the SEL signal is still high selecting the low voltage portion 202. When the CSON/CSOP voltage reaches the upper voltage threshold and higher, the SATL signal is asserted high resetting the SR latch 215, which negates the SEL signal low as shown at 303. When this occurs, the switch SW selects the high voltage portion 204 via the terminal 211. The high voltage portion 204 remains in control while the CSON/CSOP voltage remains above the upper voltage threshold all the way up to the full voltage rail of the battery BATT, e.g., up to 17–20V, and the SATL signal remains asserted.

If the CSON/CSOP voltage drops below the upper threshold voltage and still above the lower voltage threshold as shown at 305, the SATL signal is negated low. The SR latch 215 still asserts the SEL signal low selecting the high voltage portion 204. When the CSON/CSOP voltage falls below the lower voltage threshold, the SATH signal is asserted high setting the SR latch 215, which asserts the SEL signal high once again as shown at 307. When this occurs, the switch SW selects the low voltage portion 202 via the terminal 209. The low voltage portion 202 remains in control while the CSON/CSOP voltage remains below the lower voltage threshold all the way down to ground, and the SATH signal remains asserted. In this manner, the current sense amplifier 200 operates "rail—rail", that is, from the lower power supply rail (e.g., ground) to the upper power supply rail, which is the maximum voltage level of the battery BATT. The saturation thresholds of the amplifiers 201, 217 (e.g., the lower and upper voltage thresholds), along with the SR latch 215 and the switch SW implement a hysteresis function that prevents undesired switching oscillations between the low voltage portion 202 and the high voltage portion 204.

Figure 4:
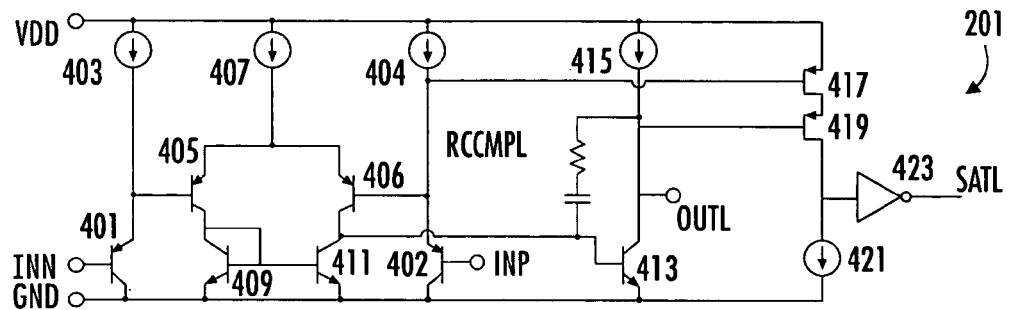
FIG. 4 is a simplified schematic diagram of an exemplary embodiment of the LVA of FIG. 2.

FIG. 4 is a simplified schematic diagram of an exemplary embodiment of the LVA 201 according to an embodiment of the present invention. An input differential pair of PNP transistors 401 and 402 have emitters coupled to receive current from a pair of current sources 403 and 404, respectively, which are coupled to VDD. The collectors of transistors 401, 402 are coupled to ground. The bases of the input transistors 401 and 402 receive respective polarity signals INN and INP forming a differential input signal, where INP is the non-inverting input (or positive input "+") and INN is the inverting input (or negative input "−") of the LVA 201. The emitters of the input differential pair 401, 402 are coupled to the respective bases of another differential pair of PNP transistors 405 and 406, having common emitters (coupled together) and biased by a current source 407 coupled to VDD. As shown, the current source 407 sources current to both of the emitters of the transistors 405 and 406. The collector of transistor 405 is coupled to the collector and base of a diode-coupled NPN transistor 409 and the collector of transistor 406 is coupled to the collector of an NPN transistor 411. The emitters of the transistors 409, 411 are coupled to ground and their bases are coupled together in a current mirror configuration.

The collector of transistor 411 is coupled to the base of an NPN transistor 413 and to one end of a series resistor-capacitor (RC) compensation circuit RCCMPL. The collector of the transistor 413 forms the output node OUTL of the LVA 201, which is also coupled to the other end of the compensation circuit RCCMPL and to a current source 415 coupled to VDD. As shown, the current source 415 sources current from VDD to the output node OUTL. VDD is coupled to the source of a P-channel FET 417, having its drain coupled to the source of another P-channel FET 419. The drain of FET 419 is coupled to an input of an inverter 423 and to a current source 421 coupled to ground. As shown, the current source 421 sinks current from the input of the inverter 423 to ground. The output of the inverter 423 asserts the SATL signal indicative of the upper voltage threshold (e.g. 3V). The gate of FET 417 is coupled to the collector of transistor 402 to detect when the input stage saturates, and the gate of 419 is coupled to the output node OUTL to detect when the output stage saturates.

The INP and INN input nodes follow each other and while they are sufficiently below VDD (e.g., below the upper threshold voltage of 3V), then the transistor 402 is on which keeps the FET 417 turned on. While the OUTL node is sufficiently below VDD (e.g., below the higher threshold voltage of 3V), then the FET 419 is turned on. While both FETs 417, 419 are both turned on, the input of the inverter 423 is pulled high to VDD and the output of the inverter 423 is pulled low asserting the SATL signal low. If the input (INP) rises above the upper threshold voltage, then the FET 417 is turned off and if the output node OUTL rises above the upper threshold voltage, then the FET 419 is turned off. If either FET 417 or 419 is turned off, then the input of the inverter 423 is pulled low via the current source 421, so that the inverter 423 asserts the SATL signal high.

Figure 5:
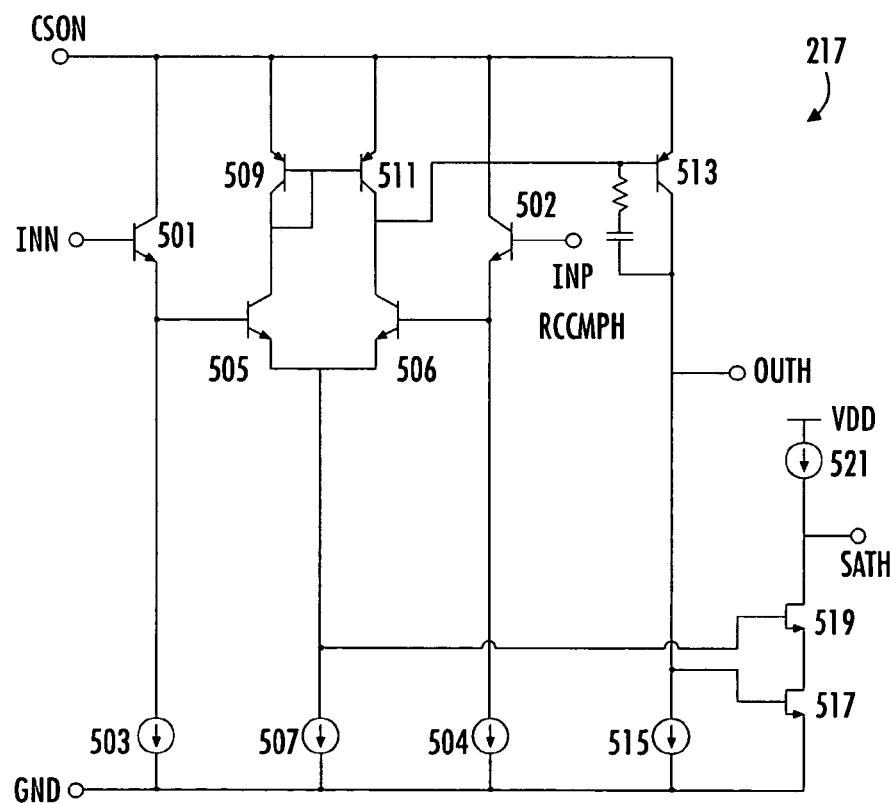
FIG. 5 is a simplified schematic diagram of an exemplary embodiment of the floating HVA of FIG. 2 according to an embodiment of the present invention.

FIG. 5 is a simplified schematic diagram of an exemplary embodiment of the floating HVA 217 according to an embodiment of the present invention. An input differential pair of NPN transistors 501 and 502 have emitters coupled to a pair of current sources 503 and 504, respectively, which are coupled to ground. The collectors of transistors 501, 502 are coupled to CSON. As shown, the current source 503 draws current from the emitter of transistor 501 to ground and the current source 504 draws current from the emitter of transistor 502 to ground. The bases of the input transistors 501 and 502 receive a differential input signal INN and INP, respectively, where INP is the non-inverting input (or positive input "+") and INN is the inverting input (or negative input "−") of the HVA 217. The emitters of the input differential pair 501, 502 are coupled to the respective bases of another differential pair of NPN transistors 505 and 506, having common emitters (coupled together) biased by a current source 507 coupled to ground. As shown, the current source 507 sinks current from the emitters of the transistors 505 and 506 to ground. The collector of transistor 505 is coupled to the collector and base of a diode-coupled PNP transistor 509 and the collector of transistor 506 is coupled to the collector of a PNP transistor 511. The emitters of the transistors 509, 511 are coupled to CSON and their bases are coupled together in a current mirror configuration.

The collector of transistor 511 is coupled to the base of a PNP transistor 513 and to one end of a series compensation circuit RCCMPH. The collector of the transistor 513 forms the output node OUTH of the HVA 217, which is also coupled to the other end of the compensation circuit RCCMPH and to a current source 515 coupled to ground. As shown, the current source 515 sinks current form OUTH to ground. The source of an N-channel FET 517 is coupled to ground and its drain is coupled to the source of another N-channel FET 519. The drain of FET 519 develops the SATH signal indicative of the lower voltage threshold, which is coupled to a current source 521 coupled to VDD. As shown, the current source 521 sources current from VDD to SATH. The gate of FET 519 is coupled to the common emitters of the transistors 505, 506 to detect when the input stage saturates, and the gate of 517 is coupled to the output node OUTH to detect when the output stage saturates.

The INP and INN input nodes follow each other and while they are sufficiently high (e.g., above the lower threshold voltage of 2V), then the transistors 505 and 506 are turned on, which turns on the FET 519. While the OUTH node is sufficiently high (e.g., above the lower threshold voltage of 2V), then the FET 519 is turned on. While both FETs 517, 519 are turned on, the SATH signal is pulled low to ground. If the input signals (INN, INP) fall below the lower threshold voltage, then the FET 519 is turned off and if the output OUTH falls below the lower threshold voltage, then the FET 517 is turned off. If either FET 517 or 519 is turned off, then the SATH signal is pulled high via the current source 521.

Figure 6:
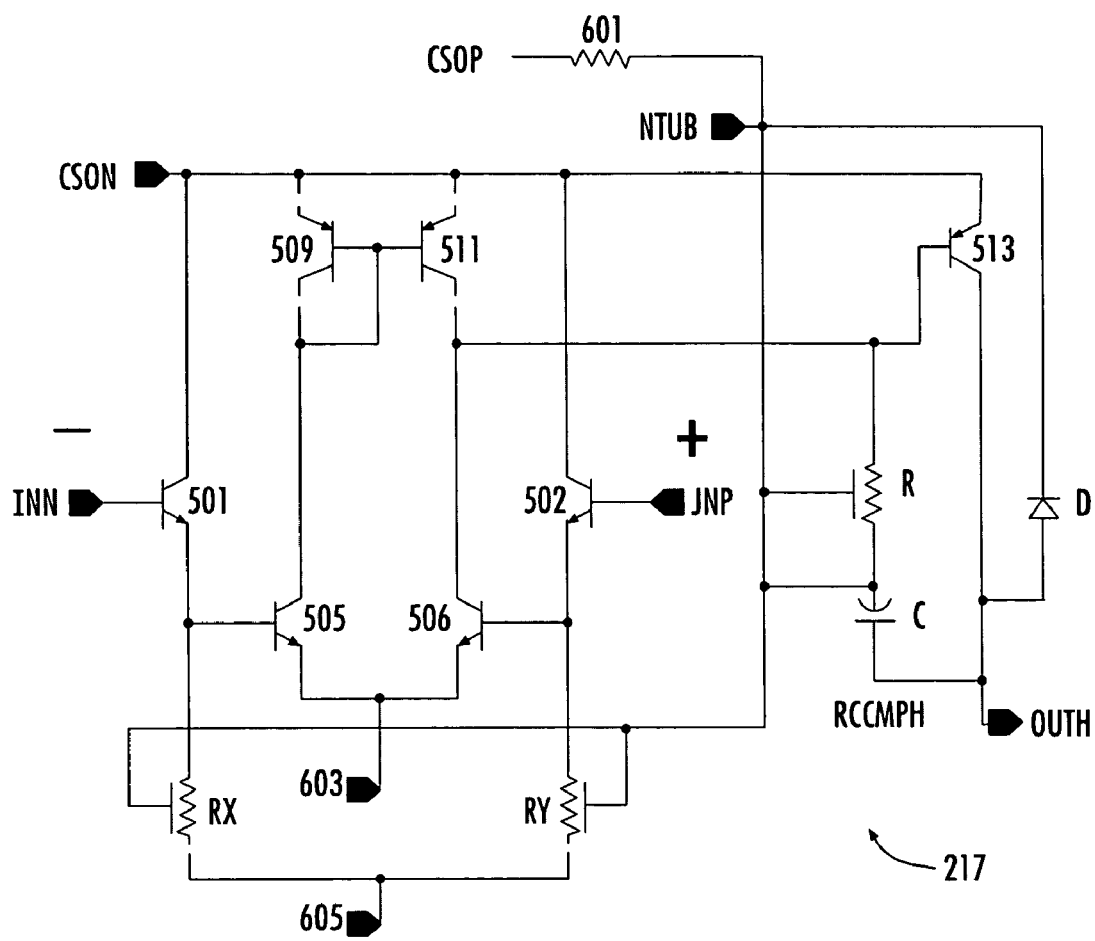
FIG. 6 is a more detailed schematic diagram of an exemplary embodiment of the floating HVA according to the present invention.

FIG. 6 is a more detailed schematic diagram of an exemplary embodiment of the floating HVA 217 according to the present invention. Similar devices as those shown in FIG. 5 are given identical reference numbers. As shown, for example, devices 501, 502, 505, 506, 509, 511, 513 and RCCMPH are shown configured in similar manner coupled relative to CSON as previously described, where RCCMPH is formed with a series-coupled resistor R and capacitor C. The components are generally implemented as low voltage devices, such as 7V devices or the like and are not generally tolerant up to the higher voltage levels of the battery BATT. As shown, some of the devices are implemented on N diffusion areas within a P-type substrate. The N diffusion areas are biased by a common signal node NTUB, which is pulled up to CSOP via a resistor (or resistive connection) 601. The resistor 601 is low enough to prevent significant voltage drop but high enough for ESD purposes, and may be on the order of 50–100 ohms. In this manner, the HVA 217 is implemented with low voltage devices but floats relative to the voltage of the CSOP signal to enable high voltage operation up to the maximum voltage level of the battery BATT.

The emitters of the transistors 505 and 506 are coupled to a common node 603, which is coupled to the current source 507. The current source 507 is implemented with higher voltage devices, such as higher voltage FET devices or the like, which allow node 603 to float upwards with CSON and CSOP. The emitter of 501 is coupled via resistor RX and the emitter of 502 is coupled via resistor RY to common node 605, which is coupled to a current source operating as the current sources 503 and 504. These current sources are implemented in similar manner as the current source 507 to allow the node 605 to float high with CSON and CSOP. A diode D has its anode coupled to the output node OUTH and its cathode coupled to node NTUB. The resistors R, RX and RY and the junction between R and C are referenced to NTUB (e.g., implemented in N diffusion areas biased by the NTUB node) to facilitate floating operation.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the following claim(s).

What is claimed is:

1. A high voltage floating current sense amplifier circuit for sensing current through a current sense device coupled between an output node and a battery node each referenced to a common node, the battery node for coupling to a positive terminal of a removable battery, said high voltage floating current sense amplifier circuit comprising:
    a first resistive device having a first end coupled to the output node and a second end;
    a floating amplifier circuit, coupled to said second end of said first resistive device and for coupling to the battery node, that drives a proportional current through said first resistive device in order to maintain voltage at said second end of said first resistive device at approximately the same voltage as the battery node; and
    a second resistive device having a first end coupled to said common node and a second end coupled to receive said proportional current for developing a sense voltage indicative of current through said current sense device.

2. The high voltage floating current sense amplifier circuit of claim 1, wherein said floating amplifier circuit comprises:
    a P-channel device having a gate, having a source coupled to said second end of said first resistive device, and having a drain coupled to said second end of said second resistive device; and
    a floating differential amplifier having a power input and a non-inverting input coupled to the battery node, and having an inverting input and an output coupled to said source and to said gate, respectively, of said P-channel device.

3. The high voltage floating current sense amplifier circuit of claim 2, wherein said floating differential amplifier comprises a plurality of low voltage devices implemented on N diffusion areas within a P-type substrate wherein said N diffusion areas are biased relative to the output node.

4. The high voltage floating current sense amplifier circuit of claim 3, wherein said floating differential amplifier includes at least one bias node, said high voltage floating current sense amplifier circuit further comprising at least one high voltage current source coupled to said at least one bias node of said floating differential amplifier that enables each said bias node to float with the battery node.

5. A power circuit, comprising:
    a switching regulator that provides power current to an output node having up to a maximum voltage level relative to a common node having a reference voltage level;
    a current sense device having a first end coupled to said output node and a second end coupled to a battery node, said battery node for coupling to a positive terminal of a removable battery that couples between said battery and common nodes;

a floating high voltage current sense amplifier circuit that develops a sense current that is proportional to current through said current sense device for voltages of said output node; and a first resistive device having a first end coupled to said common node and a second end coupled to said floating high voltage current sense amplifier circuit that receives said sense current and that develops a current sense output voltage.

6. The power circuit of claim 5, wherein said floating high voltage current sense amplifier circuit comprises:

a second resistive device having a first end coupled to said output node and a second end;

a P-channel device having a gate, a source coupled to said second end of said second resistive device and a drain coupled to said second end of said first resistive device; and a floating differential amplifier having an output coupled to said gate of said P-channel device, an inverting input coupled to said source of said P-channel device, and having a power input and a non-inverting input coupled to said battery node.

7. The power circuit of claim 6, wherein said floating differential amplifier comprises a plurality of low voltage devices implemented on N diffusion areas within a P-type substrate wherein said N diffusion areas are biased relative to said output node.

8. The power circuit of claim 7, further comprising:

said floating differential amplifier including at least one bias node; and at least one current source, each coupled to a corresponding one of said at least one bias node of said floating differential amplifier, each implemented with high voltage devices to enable each said bias node to float with said battery node.

9. A method of sensing current through a current sense device for higher voltages up to a maximum voltage level, the current sense device coupled between an output node and a battery node that couples to the high side of a removable battery, said method comprising:

coupling a first end of a first resistive device to the output node;

providing a floating differential amplifier that floats with the battery node;

driving a P-channel device coupled to a second end of the first resistive device with the floating amplifier to maintain voltage across the first resistive device substantially equal to voltage across the current sense device to develop a proportional current through the first resistive device; and applying the proportional current to a second resistive device to develop a current sense output voltage.

10. The method of claim 9, wherein said providing a floating differential amplifier comprises coupling a power input and a non-inverting input of the floating differential amplifier to the battery node.

11. The method of claim 10, wherein said providing a floating differential amplifier further comprises implementing the floating differential amplifier with a plurality of low voltage devices formed on N diffusion areas within a P-type substrate and biasing the N-diffusion areas relative to the output node.

12. The method of claim 11, wherein said providing a floating differential amplifier further comprises providing the floating differential amplifier with at least one bias node and coupling each bias node to a current source implemented with high a voltage device that enables each bias node to float with the battery node.

* * * * *